(12) United States Patent
Ogawa et al.

(10) Patent No.: US 7,674,676 B2
(45) Date of Patent: Mar. 9, 2010

(54) SEMICONDUCTOR DEVICE MANUFACTURING METHOD FOR FORMING DIFFUSED LAYERS BY IMPURITY IMPLANTATION USING GATE WIRING LAYER MASK

(75) Inventors: Kazuo Ogawa, Tokyo (JP); Yoshihiro Takaishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 22 days.

(21) Appl. No.: 12/049,414

(22) Filed: Mar. 17, 2008

(65) Prior Publication Data

US 2008/0227253 A1    Sep. 18, 2008

(30) Foreign Application Priority Data

Mar. 16, 2007    (JP) ............... 2007-068539

(51) Int. Cl.
*H01L 21/8242* (2006.01)
*H01L 27/108* (2006.01)

(52) U.S. Cl. .............. 438/253; 257/E21.646
(58) Field of Classification Search ........... 438/253; 257/E21.646

See application file for complete search history.

(56) References Cited

U.S. PATENT DOCUMENTS

| 6,081,007 A * | 6/2000 | Matsuoka | 257/285 |
| 6,413,843 B1 * | 7/2002 | Hara | 438/525 |
| 2004/0180503 A1 * | 9/2004 | Lee | 438/302 |

FOREIGN PATENT DOCUMENTS

| JP | 10-056147 | * | 2/1998 |
| JP | 2000-049344 | * | 2/2000 |
| JP | 2004-274031 | * | 9/2004 |
| JP | 2005-051140 | * | 2/2005 |

* cited by examiner

*Primary Examiner*—Matthew Smith
*Assistant Examiner*—Walter H Swanson
(74) *Attorney, Agent, or Firm*—Young & Thompson

(57) ABSTRACT

A method of manufacturing a semiconductor device with diffused layers by impurity implantation includes forming a first mask including an opening, implanting a channel impurity for threshold voltage control using the first mask, forming a first diffused layer using the first mask by implanting a first impurity, forming a first gate wiring layer and a second gate wiring layer after removing the first mask, and forming a second diffused layer and a third diffused layer using the first gate wiring layer and the second gate wiring layer as a second mask by implanting a second impurity.

20 Claims, 14 Drawing Sheets

SEMICONDUCTOR DEVICE MANUFACTURING METHOD FOR FORMING DIFFUSED LAYERS BY IMPURITY IMPLANTATION USING GATE WIRING LAYER MASK

BACKGROUND OF THE INVENTION

1. Field of the Invention

The present invention relates to a method of manufacturing a semiconductor device and, more particularly, to a method of manufacturing a memory device, such as a dynamic random access memory (DRAM) provided with memory cell transistors (or access transistors).

2. Description of the Related Art

In recent years, the application of DRAMs has spread to portable appliances and, therefore, the information retention characteristic thereof has become more important than ever. The current consumption and the power consumption of a DRAM are closely related to the information retention characteristic thereof. In general, the more excellent the information retention characteristic is, the smaller the current consumption and the power consumption can be made. The DRAM stores information by means of charge accumulation into capacitive elements. However, the accumulated charges dissipate along with the lapse of time. The information retention characteristic of the DRAM is dominated primarily by this charge dissipation characteristic.

In order to explain the mechanism of this charge dissipation, an explanation will be made of a method of manufacturing memory cell transistors as a first related art. Note that the explanation assumes that the memory cell transistors are N-type MOS transistors.

First, pad oxide film 102 and pad nitride film 103 are sequentially deposited on silicon substrate 101. Next, the pad nitride film, the pad oxide film and the silicon substrate having a predetermined depth (thickness) in portions where element-isolating regions are to be formed are selectively removed using photolithography and dry etching techniques to form trench 104 (FIG. 1a). Next, an insulating film is formed so as to fill the trench. Then, chemical-mechanical polishing (CMP) is performed using pad nitride film 103 as a polish stop layer to form element-isolating region 105 (FIG. 1b).

Next, after sequentially removing the pad nitride film and the pad oxide film using a hot phosphoric acid solution and a fluorinated acid solution, respectively, oxide film (buffer oxide film) 106 is formed anew on the exposed silicon substrate (FIG. 1c). Then, a P well (not shown in the figure) is formed using an ion implantation technique by introducing a P-type impurity to a position relatively distant from the silicon surface. In addition, channel impurity region 107 is formed by introducing a p-type impurity to the vicinity of the silicon substrate surface across the entire memory cell transistor area for the purpose of controlling the threshold voltage of a memory cell transistor (FIG. 1d).

Next, after removing the buffer oxide film using a fluorinated acid solution, gate oxide film 111, conductive film for gate electrodes 112, and insulating film for gate electrode processing 113 are sequentially deposited (FIG. 1e).

Next, the conductive film for gate electrodes is processed to predetermined dimensions using photolithography and dry etching techniques to form gate electrodes. Next, an N-type impurity is introduced using an ion implantation technique to form source/drain regions 114a and 114b of the memory cell transistor (FIG. 1f).

Next, after forming sidewall insulating films 115 on the side surfaces of the gate electrodes in a usual way, the entire memory cell area is buried with interlayer insulating film 116. Next, contact holes are formed for the source/drain regions. Then, a conductive material is filled in the contact holes to form extraction electrodes 117 (FIG. 1g).

In FIG. 1g, a storage capacitor is to be connected to the leftmost and rightmost electrodes among the three extraction electrodes and a bit line is to be connected to the middle extraction electrode. In the following description, a region where each storage capacitor-side extraction electrode and the silicon substrate are in contact with each other is referred to as a storage capacitor contact, and a region where the bit line-side extraction electrode and the silicon substrate are in contact with each other is referred to as a bit line contact, as appropriate. In addition, source/drain region 114a on the storage capacitor side is referred to as a storage capacitor-side diffused layer, and source/drain region 114b on the bit line side is referred to as a bit line-side diffused layer. Furthermore, an impurity introduced to the vicinity of the silicon substrate surface for the purpose of threshold voltage control is referred to as a channel impurity.

As the mechanisms of charge dissipation in a memory cell transistor formed as described above, there are a sub-threshold leakage current and a junction leakage current.

The sub-threshold leakage current is a current that flows from the drain to the source of the memory cell transistor in a state wherein the gate potential of the memory cell transistor is off. The magnitude of this current depends on the threshold voltage of the memory cell transistor. In order to control the sub-threshold leakage current to within given tolerance limits, the threshold voltage of the memory cell transistor must be maintained to be no smaller than a specific value. To this end, the concentration of the channel impurity must be set to a high level.

The junction leakage current is a current that flows from the storage capacitor-side diffused layer to the silicon substrate. The magnitude of this current depends on the electric field strength of a PN junction between the storage capacitor-side diffused layer and the silicon substrate. In order to suppress the junction leakage current, it is necessary to relax the junction electric field. In order to relax the junction electric field, it is conceivable to lower the impurity concentration of either the storage capacitor-side diffused layer or the silicon substrate. In the latter case, the impurity concentration of the silicon substrate is fixed by the channel impurity concentration. Hence in practice, the junction electric field is relaxed by setting the channel impurity concentration to a low level.

However, it is difficult to simultaneously suppress both the sub-threshold leakage current and the junction leakage current by adjusting the channel impurity concentration. Now assuming, for example, that the channel impurity concentration is lowered in an attempt to suppress the junction leakage current, then the threshold voltage of the memory cell transistor drops. As a result, the sub-threshold leakage current increases. Conversely, if the channel impurity concentration is heightened in an attempt to suppress the sub-threshold leakage current, then the junction leakage current increases. In this way, there exists a trade-off relationship in principle between the suppression of the sub-threshold leakage current and the suppression of the junction leakage current.

This trade-off relationship is particularly noticeable in increasingly miniaturized elements. In general, the threshold voltage of a MOS transistor drops as element dimensions diminish. This phenomenon is referred to as a short channel effect. Hence, the channel impurity concentration is set to a higher level than ever when reducing the element dimensions, in order to compensate for the threshold voltage drop due to the short channel effect. As a result, the junction leakage current increases. In this way, it has become increasingly difficult, along with the advance of miniaturization, to simultaneously suppress both the sub-threshold leakage current and the junction leakage current.

Next, a description will be made of the impurity concentration of the storage capacitor-side diffused layer. As described above, it is preferable from the viewpoint of electric field relaxation that the impurity concentration of the storage capacitor-side diffused layer be low. However, if the impurity concentration of the storage capacitor-side diffused layer is lowered excessively, the following two problems arise. First, the current driving capability of a transistor degrades as the result of an increase in the resistance of the source/drain region. Second, deterioration resistance against hot carriers degrades. The mechanism of deterioration is that the depletion of the drain region occurs and the resistance thereof increases due to hot carriers trapped, for example, in an interface between the gate-insulating film and the silicon substrate and turned into fixed charges. Note here that the lower is the impurity concentration of the diffused layer, the higher is the degree of the depletion. That is, the deterioration resistance degrades if the impurity concentration of the diffused layer is lowered. For this reason, there is a lower limit that can be set for the impurity concentration of the storage capacitor-side diffused layer. This lower limit can be set to a smaller value for lower channel impurity concentrations. This is because the above-described problems are less likely to occur if the channel impurity concentration is low.

Incidentally, the channel impurity need not be distributed across the entire memory cell transistor area. It is only necessary for the channel impurity to be distributed in regions immediately below the gate electrodes (channel regions). A variety of techniques that take advantage of this fact are under consideration. One of these techniques is described in the Related Art section of Japanese Patent Laid-Open No. 2004-274031 (Patent Document 1). Hereinafter, an explanation will be made by defining this technique as a second related art.

In the above-described first related art, the channel impurity is introduced across the entire memory cell transistor area. In contrast, in the second related art, the region of channel impurity distribution is restricted using a mask for forming openings in the regions which correspond to the regions where a region for a gate electrode to be formed later and a region for a bit line contact to be formed later are overlapped with each other. Hereinafter, the mask used for the purpose of restricting the region of channel impurity distribution is referred to as the "channel impurity mask."

FIG. 2a shows an example of disposing active region (non-element-isolating region) 201, opening position for channel impurity mask 202 and gate electrode 112.

FIG. 2b is a cross-sectional view illustrating a step of channel impurity introduction. The step shown in FIG. 2b corresponds to the above-described step shown in FIG. 1d. After forming element-isolating region 105, buffer oxide film 106 and a well (not shown in the figure) on silicon substrate 101 in the same as the first related art, resist mask 203 having an opening only in a predetermined region is formed using a photolithography technique making use of the channel impurity mask. Subsequently, a channel impurity is introduced to the vicinity of the silicon substrate surface using an ion implantation technique to form channel impurity region 107. After that, a memory cell transistor is completed by going through the same steps as those of the first related art (FIG. 2c).

Storage capacitor-side diffused layer 114a of the memory cell transistor formed as described above is not in contact with channel impurity region 107, as shown in FIG. 2c. Since this has virtually the same effect as a decrease in the channel impurity concentration, a storage capacitor-side junction electric field is relaxed and, therefore, the junction leakage current decreases. Concurrently, a predetermined threshold voltage can be obtained since there are sufficient amounts of channel impurity in silicon regions below the gate electrodes (channel regions). In this way, there is obtained the effect of simultaneously suppressing both the sub-threshold leakage current and the junction leakage current. Note that although the junction electric field of bit line-side diffused layer 114b is not relaxed, this does not affect the information retention characteristic.

However, the second related art has the problems noted below.

As has been already described, it is preferable from the viewpoint of junction leakage current that the source/drain impurity concentration be low. In the second related art, however, a larger amount of the source/drain impurity than necessary is implanted into the storage capacitor-side diffused layer. Consequently, the effect of electric field relaxation provided by restricting the region of channel impurity distribution is reduced. As a result, the effect of suppressing the junction leakage current reduces. This is the first problem with the second related art. A further explanation will be made of this problem. The amount of implanted source/drain impurity ions is fixed due to requirements for the formation of the PN junction of the bit line-side diffused layer. That is, since the channel impurity is distributed in the bit line-side contact region, the source/drain impurity must be implanted at a concentration higher than the channel impurity concentration, in order to form the PN junction of the diffused layer there. On the other hand, since the channel impurity is not distributed in the storage capacitor-side contact region, the amount of ions originally required to be implanted to form the storage capacitor-side PN junction may be smaller than the amount required for the bit line-side contact region. However, since PN junctions must be formed on the bit line side and on the storage capacitor side by a single step of source/drain impurity introduction, a larger amount of the source/drain impurity than necessary is implanted into the storage capacitor-side diffused layer.

The second problem in the second related art is that the related art is susceptible to the effect of mask misalignment in a manufacturing process. FIG. 3a shows a cross-sectional view of a step of channel impurity introduction when a channel impurity mask is misaligned to the right with respect to positions wherein a diffused layer and a gate are to be formed. FIG. 3b shows a cross-sectional view in a condition after a memory cell transistor is formed. In this case, there arises the problem in one transistor on the right side of the figure that the storage capacitor-side junction electric field increases. This is because channel impurity region 107 and storage capacitor-side diffused layer 114a come into direct contact with each other. Likewise, there arises the problem in the other transistor on the left that the threshold voltage drops. This is because the total amount of the channel impurity distributed in the silicon regions below the gate electrodes falls short of a predetermined value.

Note that Patent Document 1 proposes letting an element-isolating film protrude from the substrate surface and performing self-aligned inclined ion implantation using this protruding element-isolating film as a mask, in order to solve problems resulting from mask misalignment. With this method, however, it is not possible to obtain a sufficient effect of decreasing junction electric fields since a channel impurity is also implanted into regions other than those immediately below gate electrodes.

As a solution to the second problem in the second related art, Japanese Patent Laid-Open No. 10-56147 (Patent Document 2) describes a technique to let a channel impurity distribute in a self-aligned manner with respect to gate electrodes. Hereinafter, an explanation will be made with this technique defined as the third related art.

In the third related art described in Patent Document 2, the introduction of a channel impurity is carried out by means of self-aligned inclined ion implantation making use of a gate pattern portion as a mask.

FIG. 4a shows an example of disposing active region (non-element-isolating region) 201, mask opening position 202 and gate electrode 112.

FIG. 4b is a cross-sectional view illustrating a step of channel impurity introduction. After forming gate electrodes, there is formed mask 203 (channel impurity mask) for opening up a region for a bit line-side diffused layer. Using this mask and exposed gate pattern portions 112 and 113 also as masks, a channel impurity is introduced by performing ion implantation from an oblique direction to form channel impurity region 107. After that, a memory cell transistor is completed by going through the same steps as those of the first related art (FIG. 4c).

In the third related art, there is obtained an effect of simultaneously suppressing both the sub-threshold leakage current and the junction leakage current. The reason for this is the same as in the second related art. In addition, in the third related art, it is possible to precisely form the channel impurity region without being affected by mask misalignment since exposed gate pattern portions 112 and 113 are used as masks. This is because the position of the channel impurity based on the gate electrodes is determined in a self-aligned manner.

However, the third related art has the three problems described below.

The first problem is that like the first problem with the second related art, it is not possible to obtain a sufficient effect of decreasing the junction leakage current since a larger amount of the source/drain impurity than necessary is implanted into the storage capacitor-side diffused layer.

The second problem is that in a photolithography step for forming a channel impurity mask, it is difficult to obtain a sufficient focal depth margin and a sufficient light intensity margin. Under normal conditions, a lithography step concerned with memory cell processing is carried out after planarization processing has been performed previously. This is for the purpose of obtaining a focal depth margin or a light intensity margin necessary for manufacturing. In the third related art, however, high-precision photolithography must be carried out under the condition in which there are undulations (differences of elevation or steps) caused by the gate pattern portions. As a result, it is difficult to obtain a sufficient focal depth margin and a sufficient light intensity margin.

The third problem is a constraint on the angle of ion implantation. Angle-of-inclination range R that can be set in ion-implanting the channel impurity is determined by interval between adjacent gates S and height of gate pattern portions H (FIG. 4d). Note here that interval between adjacent gates S decreases along with an advance in miniaturization. In addition, the gate electrode becomes higher also along with an advance in miniaturization. This is because an increase in resistance due to a reduction in element dimensions is compensated by the height (thickness) of gate electrodes. Consequently, the angle-of-inclination range that can be set when implanting the channel impurity becomes narrower along with an advance in miniaturization. This means that in an increasingly miniaturized element, it is difficult to implant a sufficient amount of the channel impurity into a channel region in order to obtain a predetermined threshold voltage.

As described above, in the first related art, it is in principle difficult to simultaneously suppress both the sub-threshold leakage current and the junction leakage current.

In the second related art, although an effect of simultaneously suppressing the sub-threshold leakage current and the junction leakage current is obtainable, the impurity concentration of the storage capacitor-side source/drain region becomes higher than necessary. Thus, the second related art has the problem that it is not possible to obtain a sufficient effect of suppressing the junction leakage current. In addition, the second related art is liable to the problem of mask misalignment in a step of forming the channel impurity region. As a result, it is difficult to control the threshold voltage of the memory cell transistor, thereby causing the sub-threshold leakage current to increase, or the storage capacitor-side diffused layer and the channel impurity region to come into direct contact with each other, resulting in an increase in the junction leakage current.

In the third related art, although an effect of simultaneously suppressing the sub-threshold leakage current and the junction leakage current is obtainable, the impurity concentration of the storage capacitor-side source/drain region becomes higher than necessary. Thus, the third related art has the same problem as the second related art that it is not possible to obtain a sufficient effect of suppressing the junction leakage current. In addition, in the third related art, although there is obtained an effect of suppressing mask misalignment in a step of forming the channel impurity region, there is the problem that a photolithography step for the purpose of forming the mask becomes difficult to perform. Furthermore, the degree of constraint on the angle of implantation at the time of channel impurity implantation becomes higher along with an advance in miniaturization. Thus, there is the problem that it is not possible to form a desired channel impurity region.

SUMMARY OF THE INVENTION

An object of the present invention is to provide a manufacturing method suited for element miniaturization, the method being capable of fabricating a semiconductor device adapted to suppress a leakage current and to provide an excellent information retention characteristic.

According to an aspect of the present invention, there is provided a method of manufacturing a semiconductor device which comprises: a semiconductor substrate including an active region surrounded by an element-isolating region; a first gate wiring layer and a second gate wiring layer adjacent to each other and provided so as to traverse above the active region through a gate-insulating film; a first diffused layer provided in a region of the active region on a side between the first gate wiring layer and the second gate wiring layer; a second diffused layer provided in one region of the active region external to the side between the gate wiring layers; and a third diffused layer provided in the other region of the active region external to the side between the gate wiring layers; a first field effect transistor comprising the gate-insulating film, the first gate wiring layer, the first diffused layer and the second diffused layer; and a second field effect transistor comprising the gate-insulating film, the second gate wiring layer, the first diffused layer and the third diffused layer, the method comprising:

preparing a semiconductor substrate including an active region surrounded by an element-isolating region;

forming a first mask including an opening for forming a first diffused layer by introducing a first impurity;

implanting a channel impurity for threshold voltage control through the opening using the first mask;

forming the first diffused layer using the first mask by implanting a first impurity having a conductive type opposite to that of the channel impurity through the opening;

forming a gate-insulating film, a first gate wiring layer and a second gate wiring layer after removing the first mask; and forming a second diffused layer and a third diffused layer using the first gate wiring layer and the second gate wiring layer as a second mask by implanting a second impurity having a conductive type identical to that of the first impurity.

According to another aspect of the present invention, there is provided the aforementioned method of manufacturing the semiconductor device, wherein the implantation of the channel impurity is conducted such that the channel impurity is implanted in a direction vertical to the semiconductor substrate, and wherein the implantation of the first impurity is conducted such that the first impurity is implanted in a direction vertical to the semiconductor substrate.

According to another aspect of the present invention, there is provided any one of the aforementioned methods of manufacturing the semiconductor device, wherein in the implantation of the channel impurity and the implantation of the first impurity, the kinds of impurities and acceleration energies are set so that the range of the channel impurity is greater than the range of the first impurity.

According to another aspect of the present invention, there is provided any one of the aforementioned methods of manufacturing the semiconductor device, wherein the dose amount of the channel impurity and the dose amount of the first impurity are set larger than the dose amount of the second impurity so that a PN junction on the side between the gate wiring layers is formed of the channel impurity and the first impurity.

According to another aspect of the present invention, there is provided any one of the aforementioned methods of manufacturing the semiconductor device, wherein the dose amount of the channel impurity and the dose amount of the first impurity are set at least 10 times larger than the dose amount of the second impurity.

According to another aspect of the present invention, there is provided any one of the aforementioned methods of manufacturing the semiconductor device, further comprising:

forming trenches by selectively etching the semiconductor substrate in a region in which the first gate wiring layer is formed and in a region in which the second gate wiring layer is formed, respectively, after removing the first mask, wherein the forming of the gate-insulating film, the first gate wiring layer and the second gate wiring layer includes:

forming a gate-insulating film on the substrate surface including the trenches; and forming the first gate wiring layer and the second gate wiring layer by forming a conductive film so as to fill the trenches and patterning the conductive film.

According to another aspect of the present invention, there is provided any one of the aforementioned methods of manufacturing the semiconductor device, further comprising:

forming a bit line to be connected to the first diffused layer; and forming a first capacitor and a second capacitor to be respectively connected to the second diffused layer and the third diffused layer, wherein the semiconductor device comprises:

a first memory cell including the first capacitor and the first field effect transistor and a second memory cell including the second capacitor and the second field effect transistor.

According to the present invention, it is possible to provide a manufacturing method suited for element miniaturization, the method being capable of fabricating a semiconductor device adapted to suppress a leakage current and to provide an excellent information retention characteristic.

DETAILED DESCRIPTION OF THE PREFERRED EMBODIMENTS

Hereinafter, exemplary embodiments of the present invention will be described by taking as an example a method of manufacturing a DRAM.

As with the related arts described above, there is prepared a silicon substrate wherein an element-isolating region, a buffer oxide film and a well are formed.

Next, a photoresist pattern for opening up bit line contact regions is formed on this silicon substrate. Using this photoresist pattern as a mask (channel impurity mask), a channel impurity for threshold control and a first source/drain impurity for forming a bit line-side diffused layer are sequentially ion-implanted from a direction vertical to the silicon substrate.

Note here that the implantation conditions of the channel impurity and the first source/drain impurity are set so as to fulfill the requirements described below.

Figure 1A:
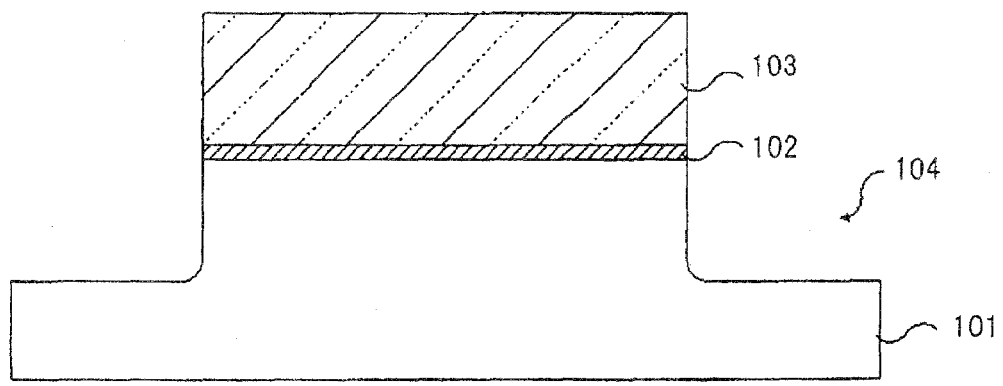
FIG. 1a is a cross-sectional view for explaining a method of manufacturing a semiconductor device in accordance with a first related art.
Figure 1B:
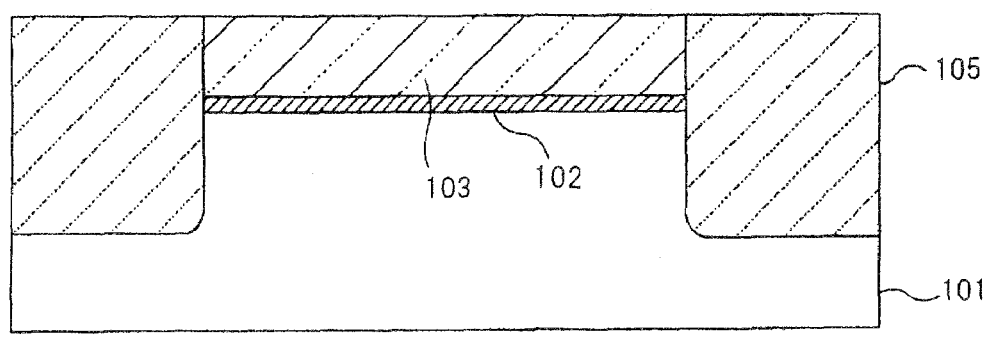
FIG. 1b is another cross-sectional view for explaining a method of manufacturing a semiconductor device in accordance with the first related art.
Figure 1C:
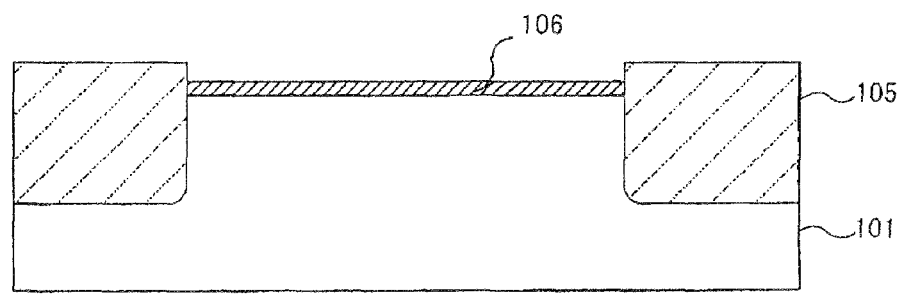
FIG. 1c is yet another cross-sectional view for explaining a method of manufacturing a semiconductor device in accordance with the first related art.
Figure 1D:
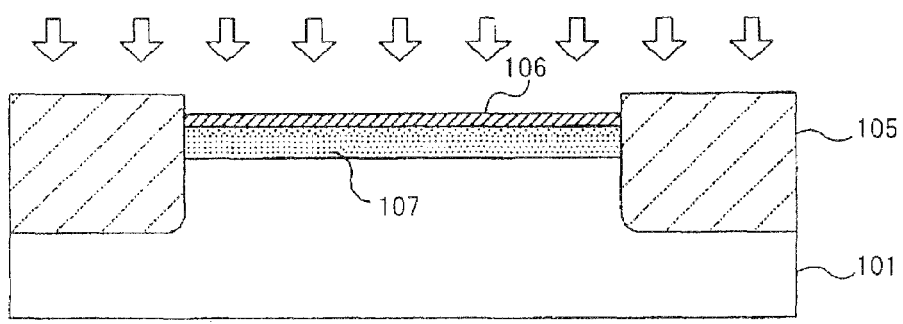
FIG. 1d is still another cross-sectional view for explaining a method of manufacturing a semiconductor device in accordance with the first related art.
Figure 1E:
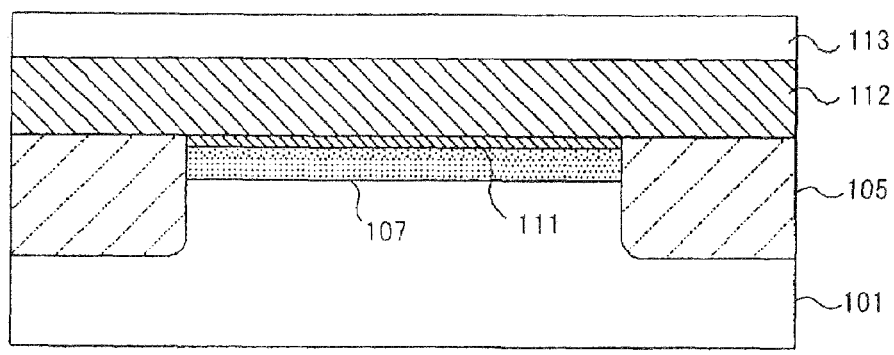
FIG. 1e is still another cross-sectional view for explaining a method of manufacturing a semiconductor device in accordance with the first related art.
Figure 1F:
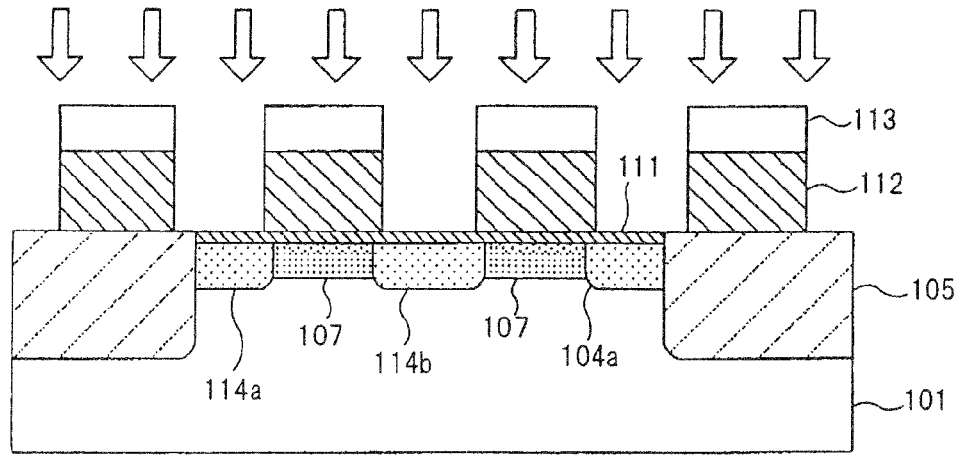
FIG. 1f is still another cross-sectional view for explaining a method of manufacturing a semiconductor device in accordance with the first related art.
Figure 1G:
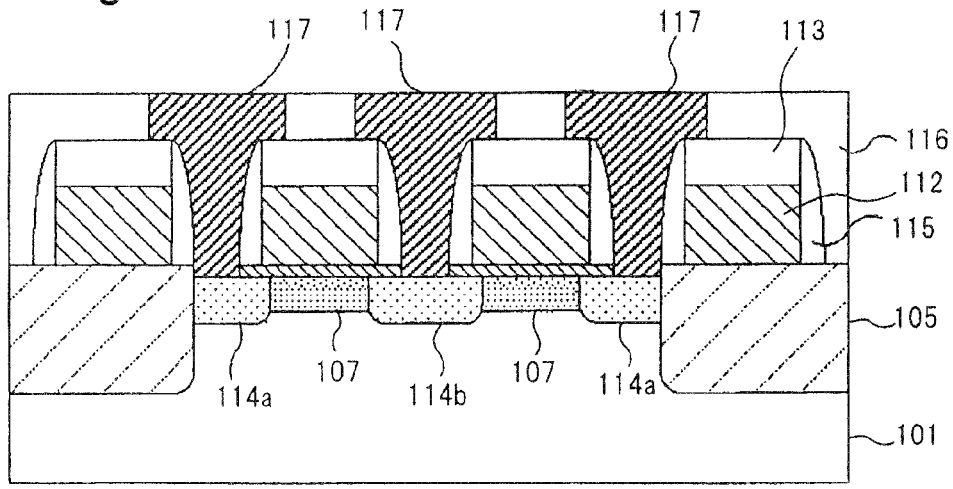
FIG. 1g is still another cross-sectional view for explaining a method of manufacturing a semiconductor device in accordance with the first related art.
Figure 2A:
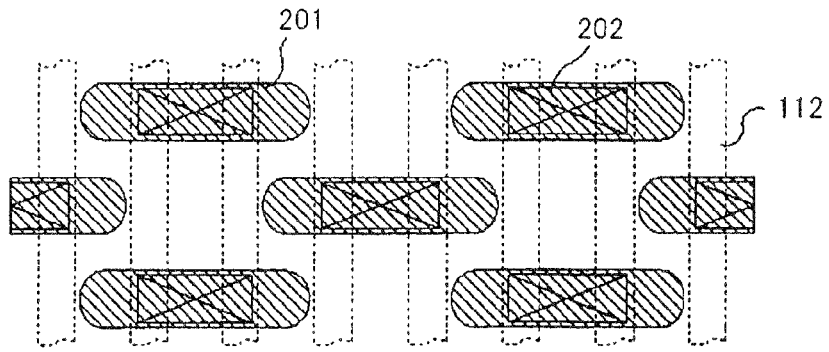
FIG. 2a is a layout chart for explaining a method of manufacturing a semiconductor device in accordance with a second related art.
Figure 2B:
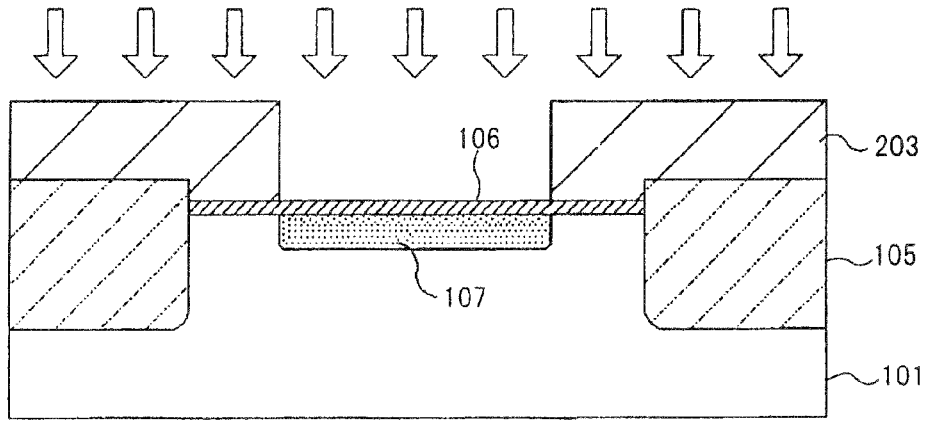
FIG. 2b is a cross-sectional view for explaining a method of manufacturing a semiconductor device in accordance with the second related art.
Figure 2C:
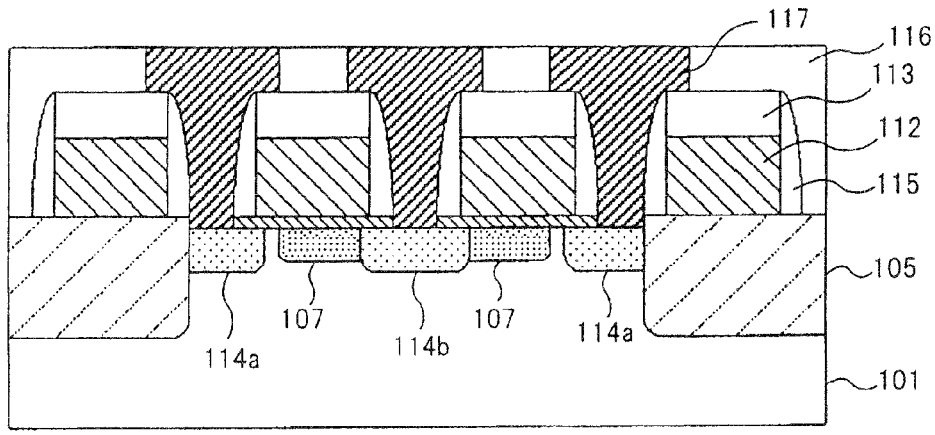
FIG. 2c is another cross-sectional view for explaining a method of manufacturing a semiconductor device in accordance with the second related art.
Figure 3A:
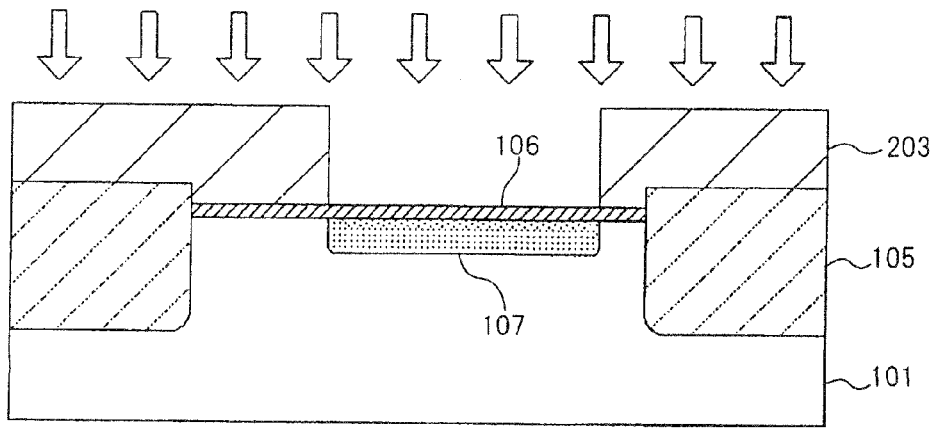
FIG. 3a is a cross-sectional view for explaining problems with a method of manufacturing a semiconductor device in accordance with the second related art.
Figure 3B:
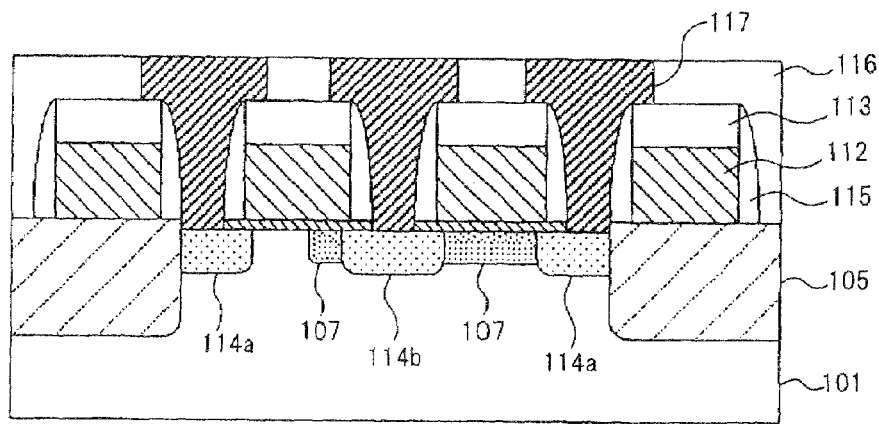
FIG. 3b is another cross-sectional view for explaining problems with a method of manufacturing a semiconductor device in accordance with the second related art.
Figure 4A:
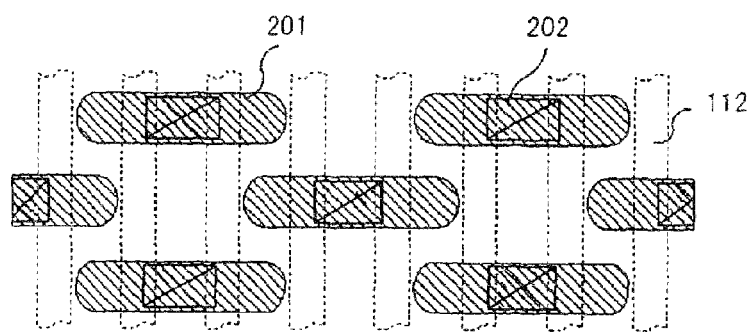
FIG. 4a is a layout chart for explaining a method of manufacturing a semiconductor device in accordance with a third related art.
Figure 4B:
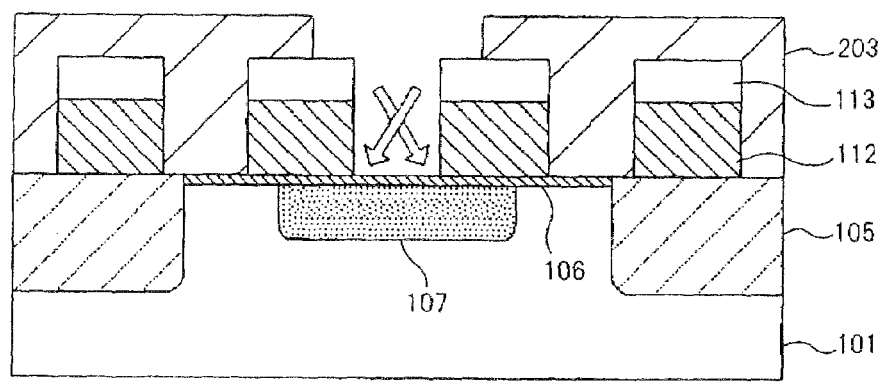
FIG. 4b is a cross-sectional view for explaining a method of manufacturing a semiconductor device in accordance with the third related art.
Figure 4C:
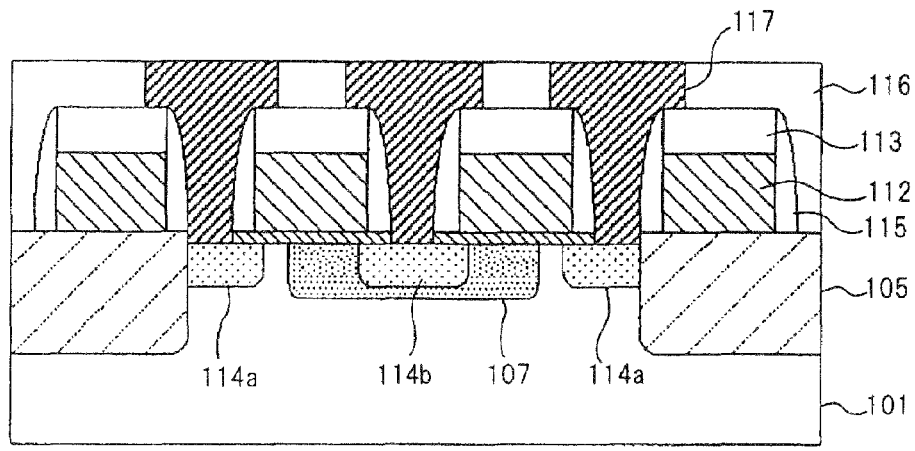
FIG. 4c is another cross-sectional view for explaining a method of manufacturing a semiconductor device in accordance with the third related art.
Figure 4D:
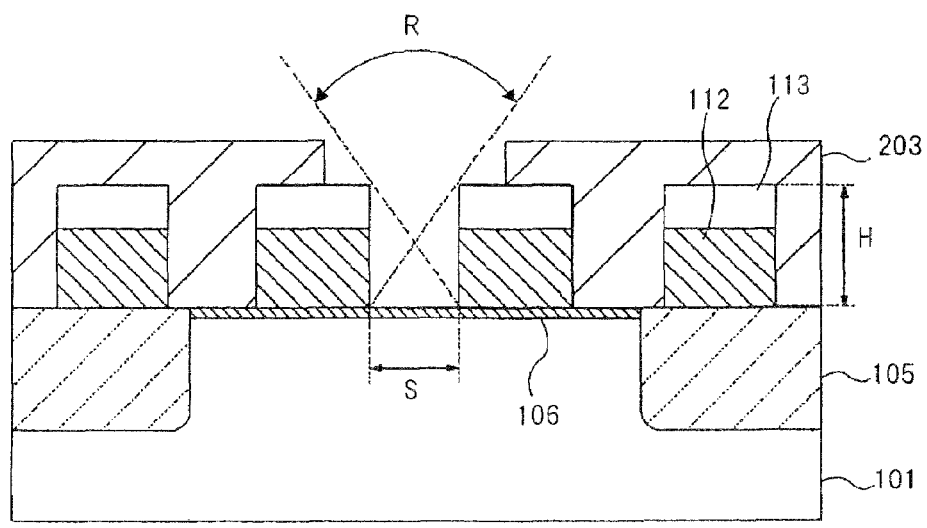
FIG. 4d is yet another cross-sectional view for explaining problems with a method of manufacturing a semiconductor device in accordance with the third related art.
Figure 5A:
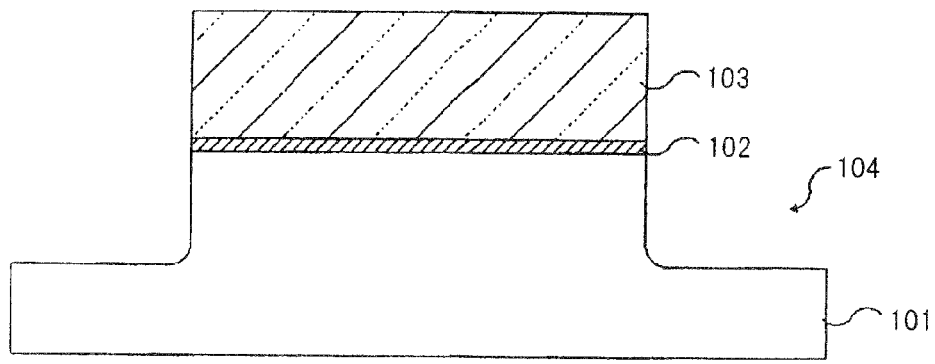
FIG. 5a is a cross-sectional view for explaining an exemplary embodiment of a method of manufacturing a semiconductor device in accordance with the present invention.
Figure 5B:
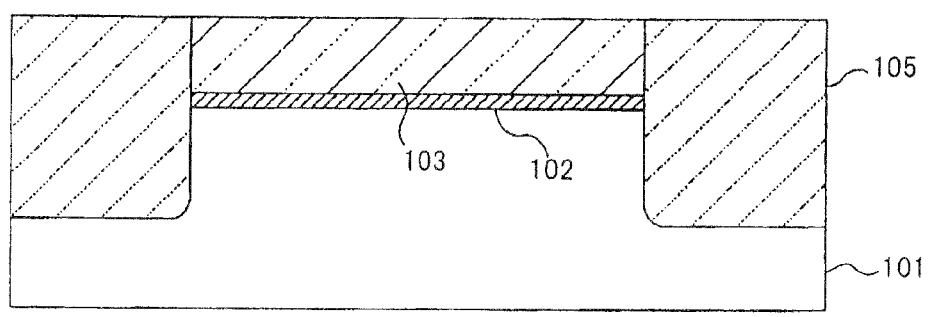
FIG. 5b is another cross-sectional view for explaining the embodiment of a method of manufacturing a semiconductor device in accordance with the present invention.
Figure 5C:
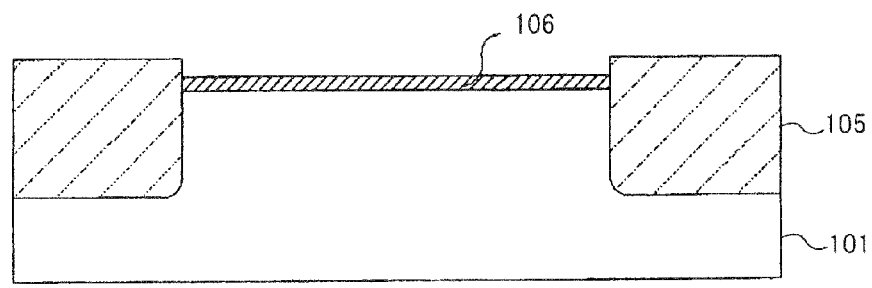
FIG. 5c is yet another cross-sectional view for explaining the embodiment of a method of manufacturing a semiconductor device in accordance with the present invention.
Figure 5D:
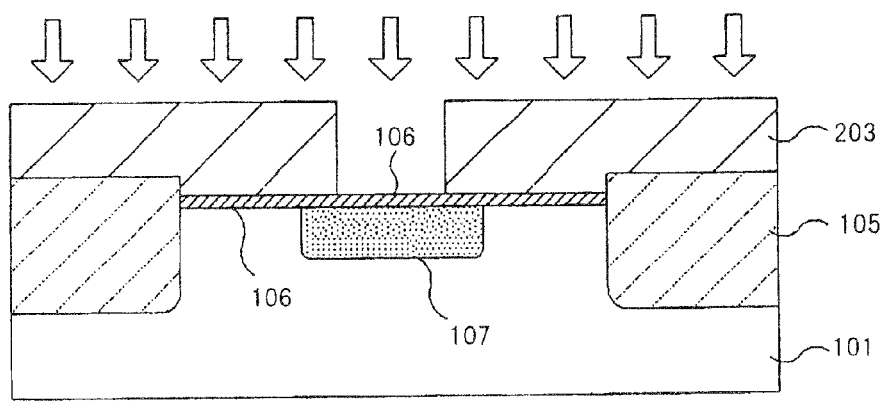
FIG. 5d is still another cross-sectional view for explaining the embodiment of a method of manufacturing a semiconductor device in accordance with the present invention.
Figure 9A:
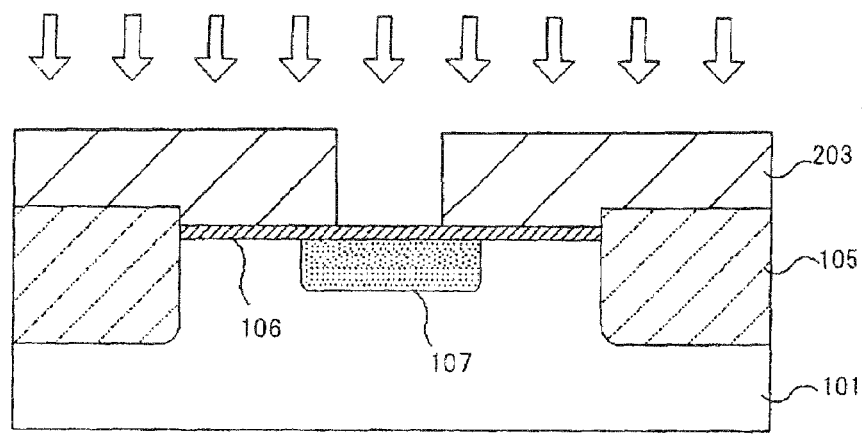
FIG. 9a is a cross-sectional view for explaining another exemplary embodiment of a method of manufacturing a semiconductor device in accordance with the present invention.
Figure 9B:
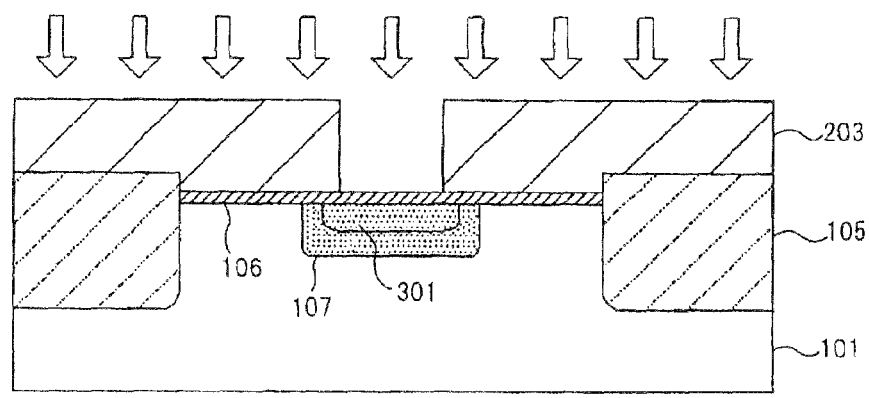
FIG. 9b is another cross-sectional view for explaining the embodiment of a method of manufacturing a semiconductor device in accordance with the present invention.
Figure 9C:
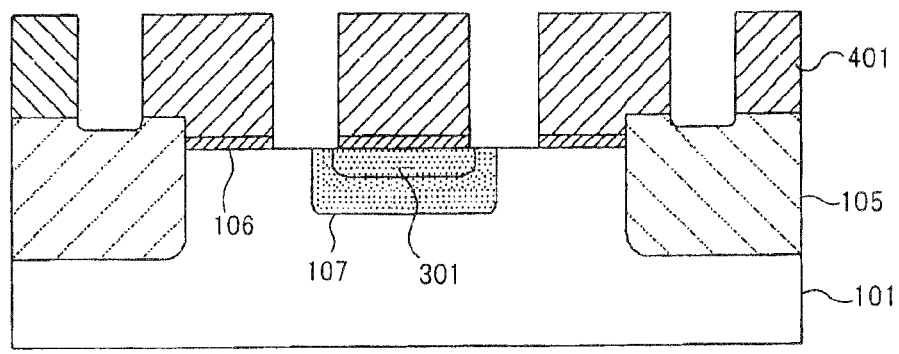
FIG. 9c is yet another cross-sectional view for explaining the embodiment of a method of manufacturing a semiconductor device in accordance with the present invention.
Figure 9D:
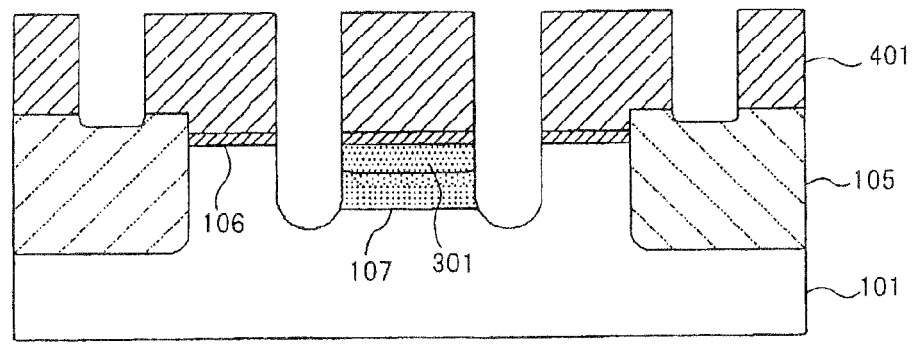
FIG. 9d is still another cross-sectional view for explaining the embodiment of a method of manufacturing a semiconductor device in accordance with the present invention.

First, ion implantation conditions (type of impurity and acceleration energy) are set so that the range of the channel impurity is greater than the range of the first source/drain impurity. Note here that the range means the projected range of implanted ions (average infiltration depth in a direction vertical to the substrate plane) or the degree of horizontal spread (degree of spread in a direction parallel with the substrate plane (standard deviation)). When forming such a planar transistor wherein a channel is formed in a direction parallel with a substrate as shown in FIG. 5g, the ion implantation conditions are set so that the degree of horizontal spread of a channel impurity is greater than that of a first source/drain impurity. When forming such a trench gate type transistor wherein a channel is formed in a direction vertical to a substrate as shown in FIG. 9f, the ion implantation conditions are set so that the projected range of a channel impurity is greater than that of a first source/drain impurity. Thus, it is possible to set ion implantation conditions in which the range of the channel impurity is greater than the range of the first source/drain impurity in both the degree of horizontal spread and the projected range. Such implantation conditions as described above are equally applicable when forming a planar transistor (FIG. 5g, i.e., a first embodiment described later) or a trench gate transistor (FIG. 9f, i.e., a second embodiment described later).

Second, the dose (amount of implantation per unit area) of the channel impurity is set so that the memory cell transistor can have a predetermined threshold voltage.

Third, the dose of the first source/drain impurity is set so that a bit line-side PN junction in a phase of completion of the memory cell transistor is virtually defined by the channel impurity and the first source/drain impurity.

The openings of the channel impurity mask are used to form the bit line-side diffused layer by introducing the first source/drain impurity, as well as to form the channel impurity region for threshold control by introducing the channel impurity. The position and size of such openings as mentioned above are set so that a predetermined bit line-side diffused layer can be formed in an active region between gate electrodes adjacent to each other. It is possible to form the channel impurity region by implanting the channel impurity from these openings.

After ion-implanting impurities as described above, the resist pattern used as the channel impurity mask is removed.

Subsequently, after removing the buffer oxide film, gate electrodes are formed on the gate-insulating film. A storage capacitor-side diffused layer is formed using these gate electrodes as masks by ion-implanting a second source/drain impurity. At this time, the dose of the second source/drain impurity is set less than the doses of the channel impurity and the first source/drain impurity so that a bit line-side PN junction is formed virtually of the channel impurity and the first source/drain impurity.

Hereafter, memory cell transistors are completed by going through the steps of forming a sidewall insulating film, an interlayer insulating film and extraction electrodes in the same way as the above-described related arts. A bit line electrically connected to the bit line-side diffused layer through the extraction electrode and a storage capacitor electrically connected to the storage capacitor-side diffused layer through the extraction electrode can be formed in a usual way.

According to the above-described manufacturing method, it is possible to realize a memory cell transistor having an excellent information retention characteristic and hardly susceptible to misalignment in a manufacturing process. In addition, in this manufacturing method, it is possible to precisely and easily form a mask comprised of a resist since the channel impurity mask is formed prior to forming the gate electrodes. Furthermore, this manufacturing method is suited for miniaturization since a desired structure can be formed without ion-implanting the channel impurity in an oblique direction.

Hereinafter, preferred embodiments of the present invention will be described further using the accompanying drawings.

First Embodiment

An exemplary embodiment of a method of manufacturing a memory cell in accordance with the present invention will be described according to FIGS. 5a to 5g. The present embodiment assumes that the memory cell transistor is an N-type MOS transistor.

First, pad oxide film 102 and pad nitride film 103 are sequentially deposited on silicon substrate 101. Next, using photolithography and dry etching techniques, in a portion where an element-isolating region is to be formed, pad oxide film 102, pad nitride film 103 and a silicon substrate having a predetermined depth are removed to form trench 104 (FIG. 5a). Note here that the pad oxide film is an approximately 10 nm thick silicon oxide film and the pad nitride film is an approximately 150 nm thick silicon nitride film. In addition, the trench is approximately 300 nm deep.

Next, using a chemical vapor deposition (CVD) method, an insulating film is deposited across the entire substrate surface so as to fill the trench. Next, using a chemical-mechanical polishing (CMP) method, the insulating film is polished with the pad nitride film used as a polish stop layer, and the entire substrate surface is planarized. As s result, there is formed element-isolating region 105 (FIG. 5b).

Next, the pad nitride film is removed using a hot phosphoric acid solution, and then the pad oxide film is removed using a fluorinated acid solution. Subsequently, buffer oxide film 106 is formed on the surface of the exposed semiconductor substrate to a thickness of approximately 10 nm (FIG. 5c). Then, using an ion implantation technique, a P-type impurity is introduced to a predetermined depth to form a well (not shown in the figure). Note here that the depth of the well as measured from the silicon substrate surface is, for example, 700 nm. Furthermore, a P-type impurity is introduced to a depth nearly the depth of the trench for the purpose of improving element isolation resistance.

Figure 6:
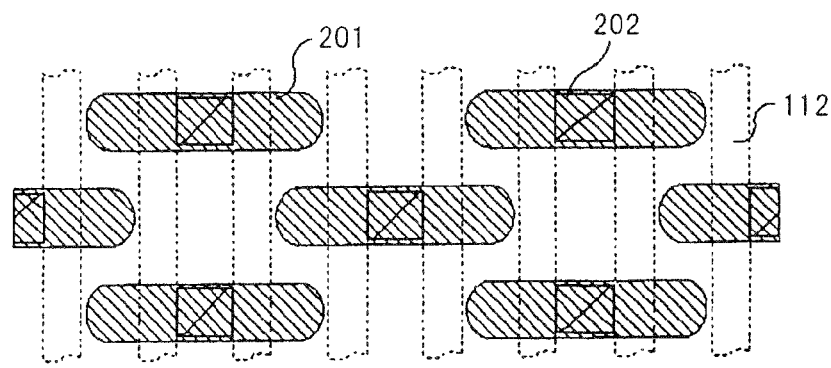
FIG. 6 is a layout chart for explaining the embodiment of a method of manufacturing a semiconductor device in accordance with the present invention.

Next, using a photolithography technique, there is formed mask (channel impurity mask) 203 comprised of a photoresist having an opening for a bit line contact region. The relationship in disposition among active region (non-element-isolating region) 201, mask opening position 202 and gate electrode 112 is as shown in FIG. 6. The film thickness of the photoresist is specified as, for example, 300 nm. Using this photoresist as a mask, a p-type impurity is ion-implanted as a channel impurity from a direction vertical to the semiconductor substrate to form channel impurity region 107 (FIG. 5d). Using boron ions ($B^+$), for example, as ionic species, ion implantation is performed from a direction vertical to the semiconductor substrate at an acceleration energy of 30 keV and at a dose of $2\times10^{13}$ ($1/cm^2$).

Figure 5E:
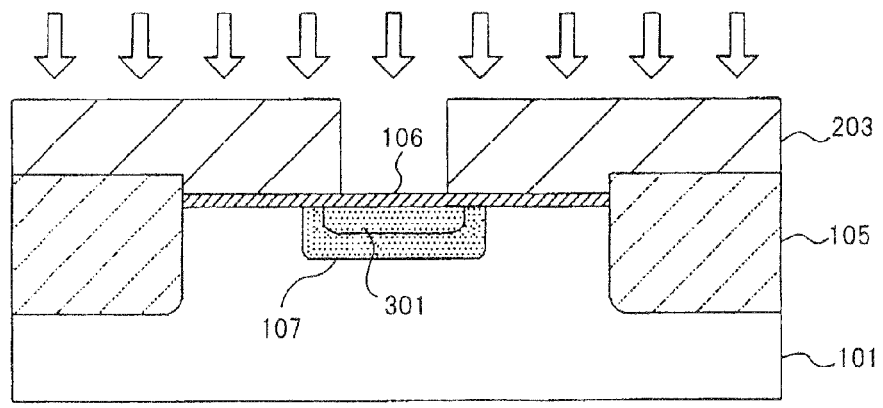
FIG. 5e is still another cross-sectional view for explaining the embodiment of a method of manufacturing a semiconductor device in accordance with the present invention.

Next, an N-type impurity is ion-implanted as a first source/drain impurity from a direction vertical to the semiconductor substrate to form first impurity-diffused layer 301 (FIG. 5e). Using arsenic ions ($As^+$), for example, as ionic species, ion implantation is performed from a direction vertical to the semiconductor substrate at an acceleration energy of 30 keV and at a dose of $3\times10^{13}$ ($1/cm^2$).

Then, after separating photoresist 203 used as a mask, buffer oxide film 106 is removed using a fluorinated acid solution.

Next, gate oxide film 111, conductive film for gate electrodes 112 and insulating film for gate electrode processing 113 are sequentially deposited. Note here that the gate oxide film is a thermally-oxidized film of 4 to 10 nm thick. The conductive film for gate electrodes is a laminated film formed of a 100 nm thick polysilicon layer containing a high-concentration impurity and of a 50 nm thick tungsten (W) silicide layer. The impurity contained in the polysilicon layer may be of either N type or P type. It is possible to use a layer of high-melting point metal, such as W, in place of the silicide layer. In this case, a barrier layer of metal, such as tungsten nitride (WN), may be provided between the polysilicon layer and the W layer for the purpose of preventing a reaction between the polysilicon and the high-melting point metal. The insulating film for gate electrode processing is, for example, a 200 nm thick silicon nitride film.

Next, using photolithography and dry etching techniques, the conductive film for gate electrodes is processed to predetermined dimensions to form gate electrodes. In the step of forming the gate electrodes, a photoresist pattern is first formed. Then, this photoresist pattern is used as a mask to process the insulating film for gate electrode processing by means of dry etching. Next, the conductive film for gate electrodes is dry-etched using the processed insulating film for gate electrode processing as a mask to obtain the gate electrodes.

Figure 5F:
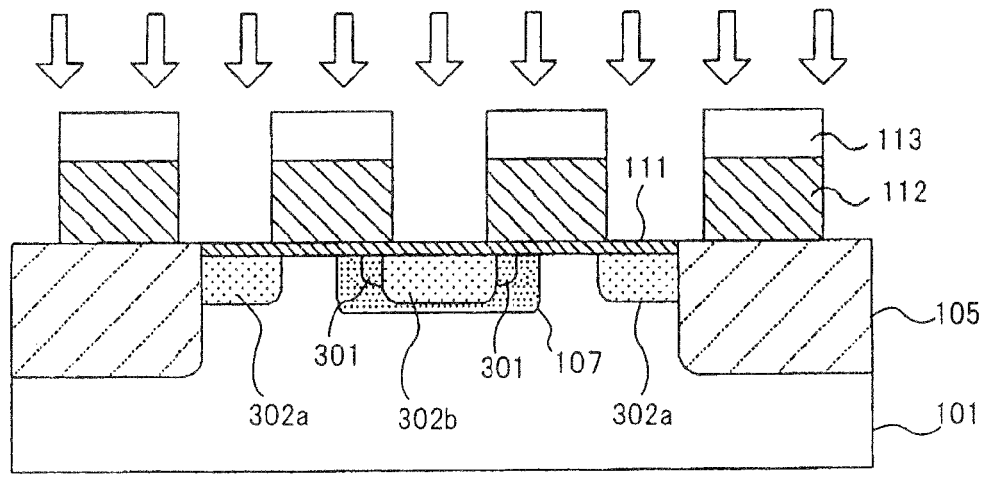
FIG. 5f is still another cross-sectional view for explaining the embodiment of a method of manufacturing a semiconductor device in accordance with the present invention.
Figure 5G:
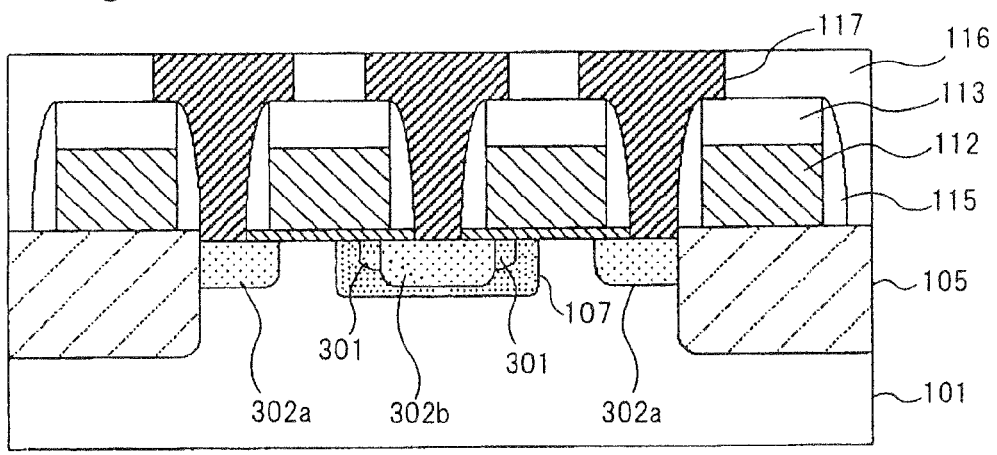
FIG. 5g is still another cross-sectional view for explaining the embodiment of a method of manufacturing a semiconductor device in accordance with the present invention.

Next, using gate electrode 112 and insulating film 113 on top thereof as a mask, an N-type impurity is ion-implanted as a second source/drain impurity to form second impurity-diffused layers 302a and 302b (FIG. 5f). Using phosphorus ions ($P^+$), for example, as ionic species, ion implantation is performed from a direction vertical to the semiconductor substrate at an acceleration energy of 40 keV and at a dose of $2\times10^{12}$ ($1/cm^2$).

Subsequently, after depositing an approximately 20 to 50 nm thick silicon nitride film using a low-pressure chemical vapor deposition (LP-CVD) method, the silicon nitride film is etched back by means of dry etching to form gate sidewall insulating film 115.

Next, interlayer insulating film 116 for burying gate electrodes is formed by forming a 500 nm thick film of boron phospho silicate glass (BPSG) using a chemical vapor deposition method, and performing a heat treatment at 800° C. for approximately 10 minutes. Then, this interlayer insulating film is subjected to chemical-mechanical polishing and thus planarized.

Next, using photolithography and dry etching techniques, contact holes are created in the interlayer insulating film. Dry etching conditions are set so that only the interlayer insulating film can be selectively etched. Accordingly, gate sidewall insulating film 115 comprised of a silicon nitride film and insulating film for gate electrode processing 113 are not etched. Thus, it is possible to create contact holes in a self-aligned manner with respect to the gate electrodes.

Next, a polysilicon film containing a high-concentration N-type impurity is formed so as to fill the contact holes. Then, extraction electrodes 117 are formed by performing chemical-mechanical polishing to remove superfluous polysilicon outside the contact holes (FIG. 5g).

In the memory cell transistor formed as described above, it is understood, when attention is focused on the region of the bit line-side diffused layer, that the PN junction is virtually defined by the impurity of channel impurity region 107 and the impurity (first source/drain impurity) of first impurity-diffused layer 301. This is because the doses of the channel impurity and the first source/drain impurity are 10 times or more larger than the dose of the impurity (second source/drain impurity) of second impurity-diffused layer 302b.

In addition, the region of the channel impurity distribution is larger than the region of the first source/drain impurity distribution. This is because the range of the channel impurity implantation (projected range and horizontal spread) is greater than the range of the first source/drain impurity implantation.

Figure 7A:
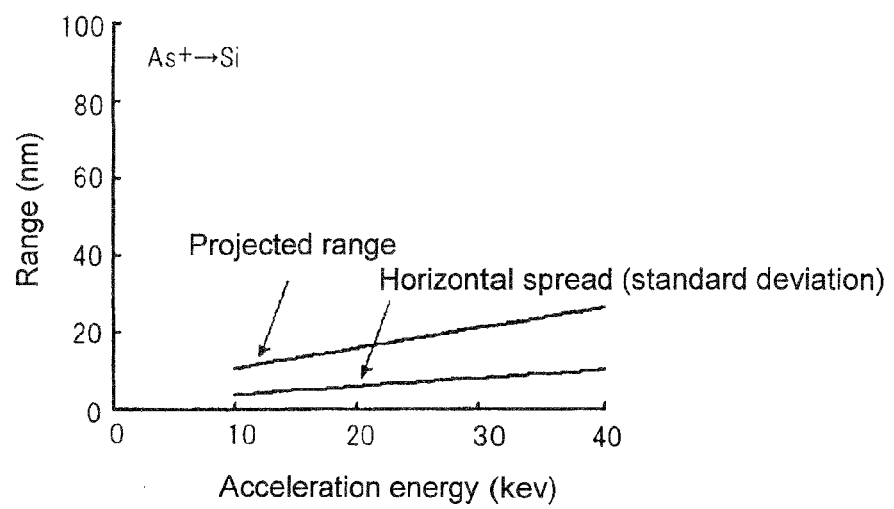
FIG. 7a is a graphical view illustrating the relationship between acceleration energy and a range when implanting impurity ions (As+) into a silicon substrate (amorphous)
Figure 7B:
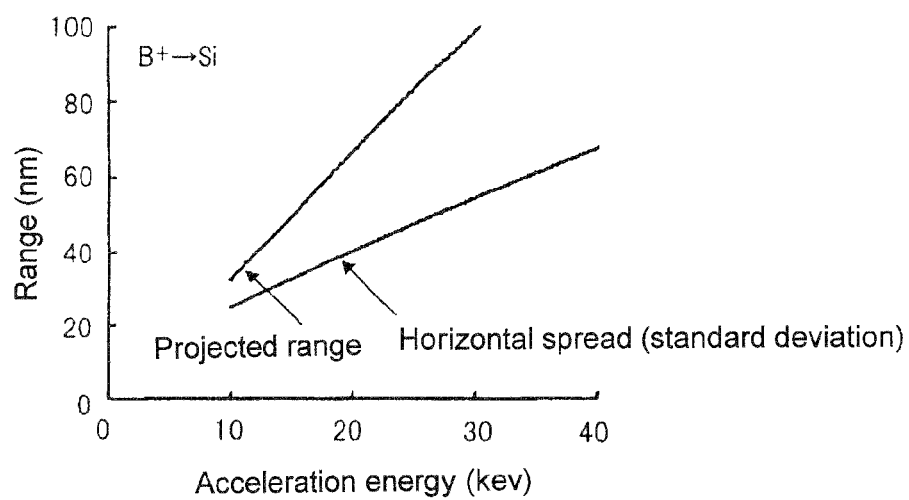
FIG. 7b is a graphical view illustrating the relationship between acceleration energy and a range when implanting impurity ions (B+) into a silicon substrate (amorphous)

Now, an explanation will be made of impurity distribution at the time of ion implantation by citing a specific example. FIGS. 7a and 7b show the relationship between acceleration energy and the range when implanting As$^+$ and B$^+$, respectively, into the silicon substrate (amorphous). In the respective figures, the upper line represents a change in the projected range, i.e., a change in the average vertical intrusion depth of implanted ions, whereas the lower line represents a change in the degree of horizontal spread using the standard deviation as an index. Referring to FIG. 7a, the degree of horizontal spread is approximately 8 nm when the first source/drain impurity As+ is implanted at an acceleration energy of, for example, 30 keV. On the other hand, referring to FIG. 7b, the horizontal spread of the channel impurity B+ implanted at an acceleration energy of 30 keV is approximately 55 nm. In this way, it is possible to differentiate the horizontal spread of impurity ion distribution even in the case of vertical ion implantation by appropriately setting the type of impurity and acceleration energy. As shown in FIG. 5g, the part of channel impurity region 107 spreading outside the region of the first source/drain impurity (first impurity-diffused layer 301) effectively functions as an impurity for threshold voltage control. Consequently, it is possible to obtain a predetermined threshold voltage and suppress a sub-threshold leakage current by appropriately setting the concentration of the channel impurity.

When attention is focused on storage capacitor-side diffused layer 302a, it is understood that the diffused layer is not in contact with channel impurity region 107. Consequently, it is possible to reduce a junction leakage current. Furthermore, since the PN junction in the bit line-side diffused layer has already been formed by the ion implantation of the first source/drain impurity, the second source/drain impurity can be introduced only for the purpose of forming a storage capacitor-side PN junction. For this reason, it is possible to lower the concentration of second impurity-diffused layer 302a and further reduce the junction leakage current.

In addition, unlike the third related art, it is possible to perform the lithography step with the substrate surface being almost flat since the lithography step for forming the channel impurity mask is performed prior to forming the gate electrodes. Accordingly, a sufficient focal depth margin and a light intensity margin can be obtained, and it is possible to precisely and easily form a mask comprised of a resist.

Next, an explanation will be made of the effect of misalignment in a manufacturing step.

Figure 8:
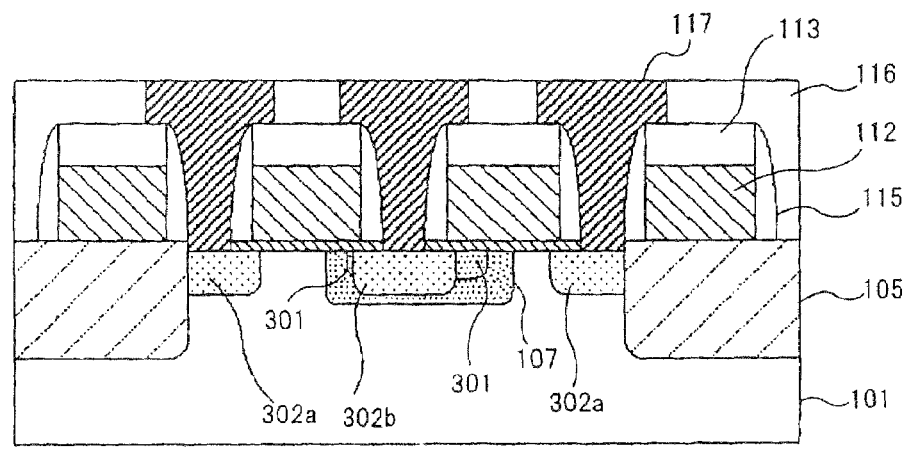
FIG. 8 is a cross-sectional view for explaining the effect of misalignment in the embodiment of a method of manufacturing a semiconductor device in accordance with the present invention.

FIG. 8 shows a cross section of a memory cell after the step explained using FIG. 5g in a case where misalignment exists between the channel impurity mask and the mask for gate formation in the first embodiment. In this case, a threshold voltage drops in the right-side transistor. This is because the distance between first impurity-diffused layer 301 forming the bit line-side diffused layer and second impurity-diffused layer 302a forming the storage capacitor-side diffused layer, i.e., the effective channel length becomes shorter due to the effect of misalignment. However, in the present invention, it is possible to previously set the threshold voltage to a high level in anticipation of this threshold voltage drop. Specifically, it is possible to set the channel impurity concentration to an even higher level. Since the channel impurity region and the storage capacitor-side diffused layer are not in contact with each other, the junction leakage current never increases even if the channel impurity concentration is set to a higher level. In this way, in the present invention, it is possible to virtually eliminate the effect of misalignment.

As described above, it is possible to realize the simultaneous suppression of both the sub-threshold leakage and the junction leakage. Thus, it is possible to virtually eliminate the effect of misalignment in a manufacturing process and easily carry out a photolithography step for forming a channel impurity mask.

Second Embodiment

Now, an explanation will be made of an example wherein the present invention is applied to a method of manufacturing a memory cell provided with a trench gate type transistor, according to FIGS. 9a to 9f.

In the same way as the first embodiment, element-isolating region 105, buffer oxide film 106 and a well are sequentially formed on silicon substrate 101. Next, channel impurity mask 203 comprised of a photoresist is formed. Using this mask, boron ions (B$^+$) are implanted as a channel impurity from a direction vertical to the semiconductor substrate at an acceleration energy of 30 keV and at a dose of $2\times10^{13}$ (1/cm$^2$) (FIG. 9a). Then, arsenide ions (As$^+$) are implanted as a first source/drain impurity from a direction vertical to the semiconductor substrate at an acceleration energy of 30 keV and at a dose of $3\times10^{13}$ (1/cm$^2$) (FIG. 9b).

After separating channel impurity mask 203, nitride film 401 is grown to a thickness of approximately 100 nm using a chemical vapor deposition method. Then, using photolithography and dry etching techniques, a portion of the nitride film in a region corresponding to a trench to be later formed on the silicon substrate is selectively etched away (FIG. 9c).

Next, silicon substrate 101 is etched using nitride film 401 as a mask. The trench formed as the result of this etching is specified as, for example, 150 nm deep (FIG. 9d).

After that, nitride film 401 is removed using a hot phosphoric acid solution, and then buffer oxide film 106 is removed using a fluorinated acid solution.

Next, in the same way as the first embodiment, gate oxide film 111, conductive film for gate electrodes 112 and insulating film for gate electrode processing 113 are sequentially deposited. At this time, the gate oxide film is also formed on the inner surface of the trench formed in the silicon substrate. In addition, the conductive film for gate electrodes is formed so as to fill the trench.

Figure 9E:
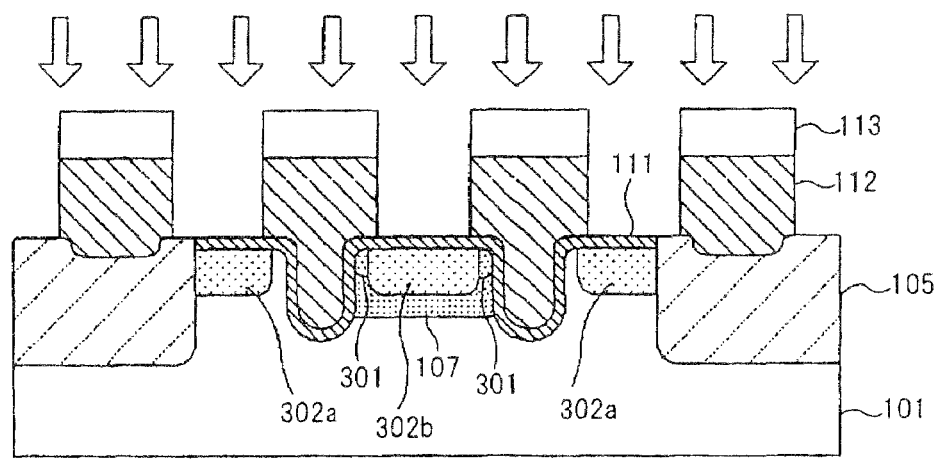
FIG. 9e is still another cross-sectional view for explaining the embodiment of a method of manufacturing a semiconductor device in accordance with the present invention.
Figure 9F:
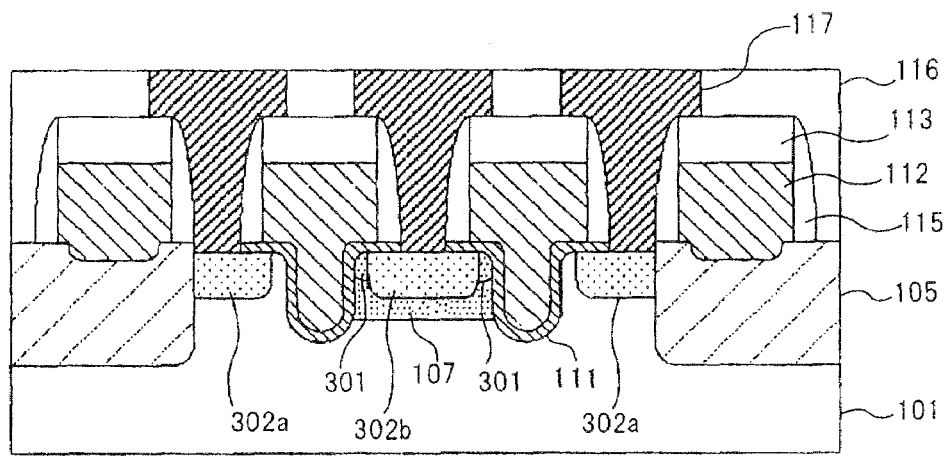
FIG. 9f is still another cross-sectional view for explaining the embodiment of a method of manufacturing a semiconductor device in accordance with the present invention.

Next, after processing the conductive film for gate electrodes to form gate electrodes in the same way as the first embodiment, a second source/drain impurity is introduced using gate electrodes 112 and insulating film 113 on top thereof as a mask (FIG. 9e). Using phosphorus ions (P$^+$), for example, as ionic species, ion implantation is performed from a direction vertical to the semiconductor substrate at an acceleration energy of 40 keV and at a dose of $2\times10^{12}$(1/cm$^2$).

Thereafter, a memory cell transistor is formed by going through the same steps as those of the first embodiment (FIG. 9f).

Referring to FIG. 7a and FIG. 7b, it is understood that the projected range of the channel impurity ($B^+$) in the second embodiment is 100 nm (acceleration energy of 30 keV). In addition, the projected range of the first source/drain impurity ($As^+$) is 20 nm (acceleration energy of 30 keV). In this way, the channel impurity effectively functions as an impurity for threshold control since the impurity is located deeper than the first source/drain impurity. Accordingly, it is possible to obtain a predetermined threshold voltage by adjusting the concentration of the channel impurity and, thereby, suppress the sub-threshold leakage current.

In addition, the channel impurity is not implanted into the region of the storage capacitor-side diffused layer and the storage capacitor-side diffused layer is not in contact with the channel impurity region. Consequently, it is possible to suppress the junction leakage current.

Furthermore, since the PN junction in the bit line-side diffused layer is virtually defined by the channel impurity and the first source/drain impurity, the second source/drain impurity can be introduced only for the purpose of forming a storage capacitor-side PN junction. For this reason, it is possible to lower the concentration of the storage capacitor-side diffused layer (second impurity-diffused layer 302a) and further reduce the junction leakage current.

The regions wherein the channel impurity and the first source/drain impurity are distributed are determined in a self-aligned manner with respect to portions within the trench of each gate electrode. This is because the silicon substrate is etched and the trench for the gate is formed after implanting the channel impurity and the first source/drain impurity. Accordingly, the second embodiment is hardly susceptible to the effect of misalignment in a manufacturing process.

Since the lithography process for forming the channel impurity mask is performed prior to forming the gate electrodes, it is possible to perform the lithography step with the substrate surface being almost flat. Accordingly, a sufficient focal depth margin and a sufficient light intensity margin can be obtained, and it is possible to precisely and easily form a mask comprised of a resist.

What is claimed is:

1. A method of manufacturing a semiconductor device, comprising:
   preparing a semiconductor substrate including an active region surrounded by an element-isolating region;
   forming a first mask including an opening for forming a first diffused layer;
   implanting a channel impurity for threshold voltage control through the opening using the first mask;
   forming the first diffused layer using the first mask by implanting a first impurity having a conductive type opposite to that of the channel impurity through the opening;
   forming a gate-insulating film, a first gate wiring layer and a second gate wiring layer after removing the first mask; and
   forming a second diffused layer and a third diffused layer using the first gate wiring layer and the second gate wiring layer as a second mask by implanting a second impurity having a conductive type identical to that of the first impurity,
   wherein the first gate wiring layer and the second gate wiring layer are adjacent to each other and are provided so as to traverse above the active region through the gate-insulating film,
   the first diffused layer is provided in a region of the active region on a side between the first gate wiring layer and the second gate wiring layer,
   the second diffused layer is provided in one region of the active region external to a side between the gate wiring layers,
   the third diffused layer is provided in an other region of the active region external to the side between the gate wiring layers, and
   the semiconductor device includes a first field effect transistor comprising the gate-insulating film, the first gate wiring layer, the first diffused layer and the second diffused layer, and a second field effect transistor comprising the gate insulating film, the second gate wiring layer, the first diffused layer and the third diffused layer.

2. The method of manufacturing a semiconductor device according to claim 1, wherein the implantation of the channel impurity is conducted such that the channel impurity is implanted in a direction vertical to the semiconductor substrate, and wherein the implantation of the first impurity is conducted such that the first impurity is implanted in a direction vertical to the semiconductor substrate.

3. The method of manufacturing a semiconductor device according to claim 1, wherein in the implantation of the channel impurity and in the implantation of the first impurity, the kinds of impurities and acceleration energies are set so that the range of the channel impurity is greater than the range of the first impurity.

4. The method of manufacturing a semiconductor device according to claim 1, wherein a dose amount of the channel impurity and a dose amount of the first impurity are set larger than a dose amount of the second impurity so that a PN junction on the side between the gate wiring layers is formed of the channel impurity and the first impurity.

5. The method of manufacturing a semiconductor device according to claim 4, wherein the dose amount of the channel impurity and the dose amount of the first impurity are set at least 10 times larger than the dose amount of the second impurity.

6. The method of manufacturing a semiconductor device according to claim 4, wherein the dose amount of the channel impurity and the dose amount of the first impurity are set at least 10 times larger than the dose amount of the second impurity.

7. The method of manufacturing a semiconductor device according to claim 1, further comprising:
   forming trenches by selectively etching the semiconductor substrate in a region in which the first gate wiring layer is formed and in a region in which the second gate wiring layer is formed, respectively, after removing the first mask,
   wherein the forming of the gate-insulating film, the first gate wiring layer and the second gate wiring layer includes:
   forming a gate-insulating film on the substrate surface including the trenches; and
   forming the first gate wiring layer and the second gate wiring layer by forming a conductive film so as to fill the trenches and patterning the conductive film.

8. The method of manufacturing a semiconductor device according to claim 1, further comprising:
   forming a bit line to be connected to the first diffused layer; and
   forming a first capacitor and a second capacitor to be respectively connected to the second diffused layer and the third diffused layer,
   wherein the semiconductor device comprises:
   a first memory cell including the first capacitor and the first field effect transistor; and a second memory cell including the second capacitor and the second field effect transistor.

9. The method of manufacturing a semiconductor device according to claim 1, wherein the channel impurity is boron ions at a dose of $2 \times 10^{13}$ cm$^{-2}$.

10. The method of manufacturing a semiconductor device according to claim 1, wherein the first impurity is arsenic ions at a dose of $3 \times 10^{-}$cm$^{-2}$.

11. The method of manufacturing a semiconductor device according to claim 1, wherein the second impurity is arsenic ions at a dose of $2 \times 10^{12}$ cm$^{-2}$.

12. The method of manufacturing a semiconductor device according to claim 1, wherein a part of a channel impurity region spreading outside a region of a first source drain impurity functions as an impurity for threshold voltage control.

13. The method of manufacturing a semiconductor device according to claim 12, wherein a concentration of the part of the channel impurity regions spreading outside the region of the first source drain impurity obtains a predetermined threshold voltage and suppresses sub-threshold leakage current.

14. The method of manufacturing a semiconductor device according to claim 12,
wherein the first gate wiring layer and the second gate wiring layer are adjacent to each other and are provided so as to traverse above the active region through the gate-insulating film,
the first diffused layer is provided in a region of the active region on a side between the first gate wiring layer and the second gate wiring layer,
the second diffused layer is provided in one region of the active region external to a side between the gate wiring layers,
the third diffused layer is provided in an other region of the active region external to the side between the gate wiring layers, and
the semiconductor device includes a first field effect transistor comprising the gate-insulating film, the first gate wiring layer, the first diffused layer and the second diffused layer, and a second field effect transistor comprising the gate insulating film, the second gate wiring layer, the first diffused layer and the third diffused layer.

15. The method of manufacturing a semiconductor device according to claim 1, wherein the second impurity forms a storage capacitor-side PN junction with a reduced junction leakage current.

16. A method of manufacturing a semiconductor device, comprising:
preparing a semiconductor substrate including an active region surrounded by an element-isolating region;
forming a first mask including an opening for forming a first diffused layer;
implanting a channel impurity for threshold voltage control through the opening using the first mask;
forming the first diffused layer using the first mask by implanting a first impurity having a conductive type opposite to that of the channel impurity through the opening;
forming a gate-insulating film, a first gate wiring layer and a second gate wiring layer after removing the first mask; and
forming a second diffused layer and a third diffused layer using the first gate wiring layer and the second gate wiring layer as a second mask by implanting a second impurity having a conductive type identical to that of the first impurity,
wherein a dose amount of the channel impurity and a dose amount of the first impurity are set larger than a dose amount of the second impurity so that a PN junction on the side between the gate wiring layers is formed of the channel impurity and the first impurity.

17. The method of manufacturing a semiconductor device according to claim 16, wherein in the implantation of the channel impurity and in the implantation of the first impurity, the kinds of impurities and acceleration energies are set so that the range of the channel impurity is greater than the range of the first impurity.

18. The method of manufacturing a semiconductor device according to claim 16, wherein the channel impurity is boron ions at a dose of $2 \times 10^{13}$ cm$^{-2}$.

19. The method of manufacturing a semiconductor device according to claim 16, wherein the first impurity is arsenic ions at a dose of $3 \times 10^{13}$ cm$^{-2}$.

20. The method of manufacturing a semiconductor device according to claim 16, wherein the second impurity is arsenic ions at a dose of $2 \times 10^{12}$ cm$^{-2}$.

* * * * *